(12) United States Patent
Takase (10) Patent No.: US 6,567,336 B2
(45) Date of Patent: *May 20, 2003

(54) SEMICONDUCTOR MEMORY FOR LOGIC-HYBRID MEMORY

(75) Inventor: Satoru Takase, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/888,649

(22) Filed: Jun. 26, 2001

(65) Prior Publication Data

US 2001/0030902 A1 Oct. 18, 2001

Related U.S. Application Data (62) Division of application No. 09/477,032, filed on Jan. 3, 2000, now Pat. No. 6,370,080, which is a continuation of application No. 08/949,762, filed on Oct. 14, 1997, now Pat. No. 6,134,174.

(30) Foreign Application Priority Data

Oct. 14, 1996 (JP) .............................. 8-270692

(51) Int. Cl.⁷ ................................................. G11C 8/00
(52) U.S. Cl. ........................... 365/230.06; 365/230.01; 365/206
(58) Field of Search ....................... 365/230.06, 230.01, 365/206, 200

(56) References Cited

U.S. PATENT DOCUMENTS

| | | | |
|---|---|---|---|
| 5,036,227 A | 7/1991 | Jo et al. | |
| 5,311,467 A | * 5/1994 | Lysinger et al. | 365/230.06 |
| 5,379,261 A | 1/1995 | Jones, Jr. | |
| 5,559,753 A | 9/1996 | Kocis | |
| 5,583,816 A | 12/1996 | McClure | |
| 5,661,683 A | * 8/1997 | Song | 365/230.06 |
| 5,751,645 A | 5/1998 | Tsukikawa | |
| 5,875,148 A | 2/1999 | Tanaka et al. | |
| 5,892,726 A | 4/1999 | Moon et al. | |
| 5,896,336 A | 4/1999 | McClure | |

FOREIGN PATENT DOCUMENTS

JP 05-334879 12/1993

OTHER PUBLICATIONS

A 500–Megabyte/s Data–Rate 4.5M DRAM, N. Kushiyama, S. Ohshima, D. Stark, H. Noji, K. Sakurai, S. Takase, T. Furuyama, R. M. Barth, A. Chan, J. Dillon, J.A. Gasbarro, M.M. Griffin, M. Horowitz, T.H. Lee Victor Lee, IEEE Journal of Solid State Circuits, vol. 28, No. 4, Apr. 1993.

* cited by examiner

Primary Examiner—Huan Hoang
(74) Attorney, Agent, or Firm—Banner & Witcoff, Ltd.

(57) ABSTRACT

This invention provides ways to intercept abnormal power signals to prevent damaging the memory in a semiconductor. To achieve this, the semiconductor memory comprises a first control signal line controlling a selection from row addresses, a second control signal line controlling a selection from column addresses, a first voltage control means cutting off the first control signal line in case that predetermined number of control signals are abnormal, and a second voltage control means cutting off the second control signal line in case that predetermined number of control signals are abnormal.

41 Claims, 6 Drawing Sheets

SEMICONDUCTOR MEMORY FOR LOGIC-HYBRID MEMORY

This application is a divisional of U.S. application Ser. No. 09/477,032, filed Jan. 3, 2000, now U.S. Pat. No. 6,370,080, which is a continuation of U.S. application Ser. No. 08/949,762, filed Oct. 14, 1997 now U.S. Pat. No. 6,134,174.

BACKGROUND OF THE INVENTION

1. Field of the Invention

This invention relates to a dynamic RAM used in semiconductor memory systems.

2. Background of the Invention

In recent years, the width of circuits in semiconductor devices has decreased. This reduction in circuit width has increased the capacity of semiconductor memory. As memory capacity increases, the memory is referred to as large scaled. As memory size increases, memory efficiency is a desired quality. Logic-hybrid memory includes a logic block that functions beyond merely controlling reading and writing to specific memory cells. Logic blocks also control a signal called an I/F signal that performs an interface (I/F) between the logic block and the memory block.

An example of this type of semiconductor where the semiconductor chip includes a logic circuit and a memory is described in "A 500-Megabyte/n Data-Rate 4.5M DRAM" Kushiyama et al., *IEEE Journal of Solid-State Circuits* Vol. 28, No. 4, April 1993. This article illustrates in FIGS. 4 and 10 and describes a memory block (DRAM CORE) and a logic block (INTERFACE LOGIC) in a chip. Signals, such as /RAS, /CAS, and an address signal are control signals from the exterior of the chip, or in a conventional memory chip are the interface (I/F) signals sent between the logic block and the memory block. The I/F signals are basic signals for control of the logic block and operations of the memory block.

Usually, the logic block controls the I/F signal so that the memory block can operate normally. However, problems occur when the logic block does not operate normally. This may be due to abnormal signals generated by the logic block operating in an unstable state. Often these unstable states occur immediately after power is turned on. Other events causing abnormal signals are temporary, unexpected wave forms from the logic block due to various external factors, such as a changing power source or a change in temperature during a burn-in examination.

When memory block receives an abnormal signal, dangerous, large currents can be generated damaging the internal circuit of the memory block. This event may cause latch up and can fatally damage the semiconductor package or circuit board. If the memory block is not initialized correctly, the reading and writing operations normally performed when the power source is turned on cannot be performed. The problem of conventional logic-hybrid memory is the logic block and the memory block are connected to each other only through the I/F signal. No mechanism protects the memory block against abnormal signals generated by the logic block.

SUMMARY OF THE INVENTION

This invention provides semiconductor protection for memory that is susceptible to abnormal and damaging signals from the logic block. An object of the invention is the interruption of abnormal signals from the logic block. This is accomplished by the semiconductor memory having a first control signal line controlling a selection from row addresses, a second control signal line controlling a selection from column addresses, a first voltage control system cutting off the first control signal line in case a predetermined number of control signals are abnormal, and a second voltage control system cutting off the second control signal line in case a predetermined number of control signals are abnormal, preventing these abnormal signals from reaching the memory cell array.

BRIEF DESCRIPTION OF DRAWINGS

Features of this invention will be best understood from the following detailed description taken in conjunction with the drawings.

DETAILED DESCRIPTION OF THE PREFERRED EMBODIMENT

Figure 1A:
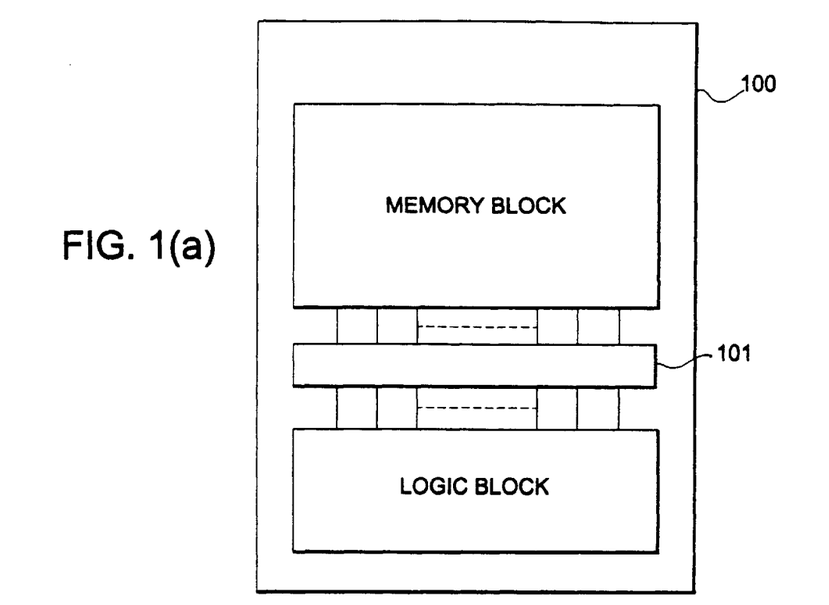
FIG. 1(a) and FIG. 1(b) are schematic views of the logic-hybrid memory of this invention.
Figure 1B:
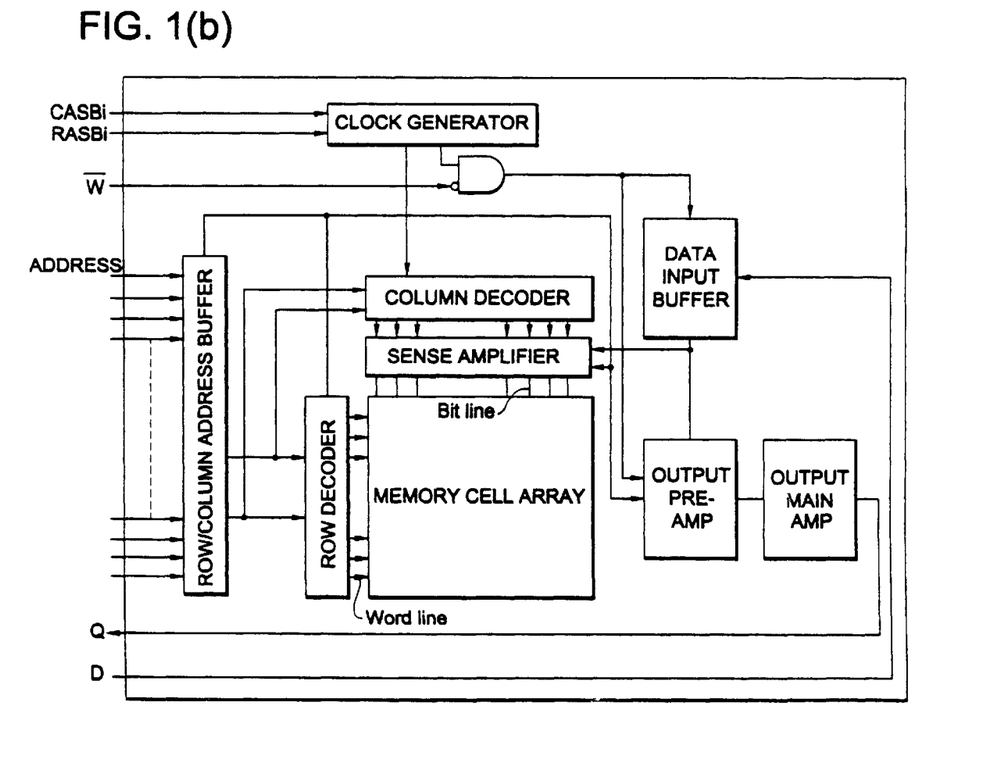

This invention is described with four embodiments. FIGS. 1(a) though 5 illustrate the first embodiment. FIGS. 1(a) illustrate a schematic view of the logic-hybrid memory and a circuit structure of the memory and control blocks. The first voltage control circuit is arranged in an interface block 101 in the logic-hybrid memory 100. FIG. 1(b) illustrates the circuit's overall operational aspects in FIG. 1(a). The memory cell array has row addresses and column addresses used by the row decoder and column decoder, respectively.

Figure 2:
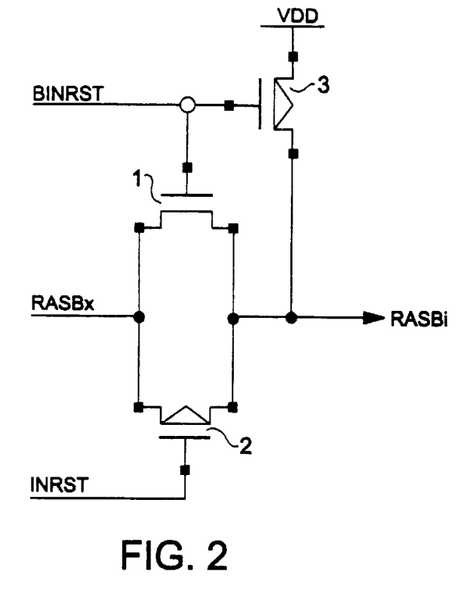
FIG. 2 shows part of the first voltage control circuit.

The first voltage control circuit is partially illustrated in FIG. 2. The first voltage control circuit comprises NMOS transistor 1 and PMOS transistors 2 and 3. The NMOS transistor 1 and the PMOS transistor 2 are transfer gates. The gate electrode of the PMOS transistor 2 is connected to a reset signal line of inner circuit INRST, and the gate electrode of the NMOS transistor 1 is connected to signal line BINRST (reversal signal of INRST). The input of this transfer gate is connected to signal line RASBx, and the output is connected to RASBi. RASB is the reverse signal of the Row Address Strobe signal. RASBx is the external signal line of RASB, and RASBi is the internal signal line of RASB. Therefore, RASBi is connected to the word line and memory cell array through a row decoder illustrated in FIG. 1(b). RASBx is connected to the circuit in the logic block in FIG. 1(a). A source of the PMOS transistor 3 is connected to the high voltage power source VDD and a drain is connected to RASBi. A gate is connected to signal line BINRST.

Figure 3:
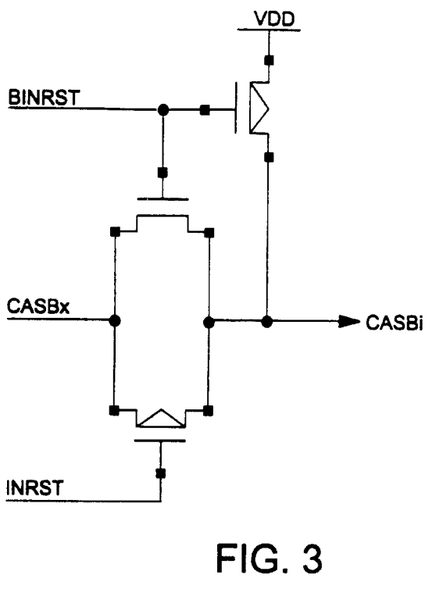
FIG. 3 shows one part of the second voltage control circuit.

The second voltage control circuit is illustrated in FIG. 3. The circuit diagram for the second voltage control circuit illustrated in FIG. 3 is similar to the circuit diagram for the first voltage control circuit illustrated in FIG. 1(a). The difference between the two circuits is the circuit in FIG. 3 is coupled between CASBi and CASBx instead of RASBx and RASBi. CASB is the reversal signal of the Column Address Strobe Signal. CASBx is the external signal line of CASB and CASBi is the internal signal line of CASB. Therefore, CASBi is connected to the bit line through the column decoder in FIG. 1(b). CASBx is connected to the circuit in the logic block in FIG. 1(a).

Figure 4:
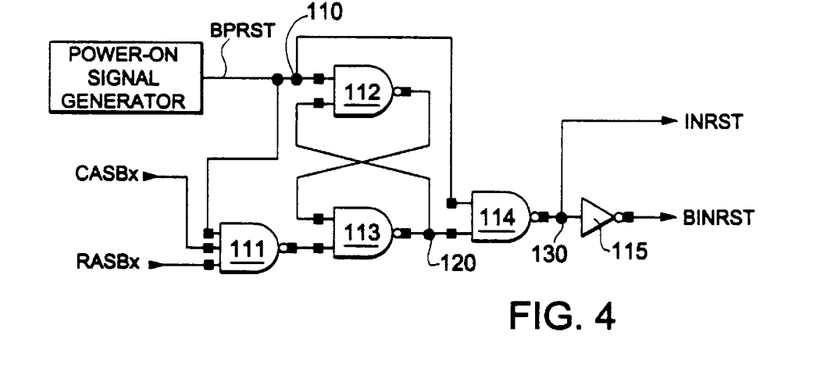
FIG. 4 shows another part of the first and second voltage control circuits in the first embodiment of this invention.

FIG. 4 illustrates another view of the first voltage control circuit and the second voltage control circuit illustrated in FIGS. 2 and 3. As shown in FIG. 4, the circuit has NAND gates 111–114 and an inverter 115. RASBx, CASBx, and BPRST are connected to the input leads of NAND gate 111. BPRST is generated from the power on signal generator and keeps the circuit in FIG. 4 in reset state by the time the memory in FIG. 1(a) turns on. When BPRST is "L," the circuit in FIG. 4 is in a reset state. When BPRST is "H," the circuit in FIG. 4 is in the activated state. The output of the NAND gate 113 and the power on signal generator are connected to the input of the NAND gate 112. The outputs of the NAND gate 111 and 112 are coupled to the input of the NAND gate 113. The input of the NAND gate 114 is connected to the output power on signal generator and the NAND gate 113. The output of the NAND gate 114 is connected to the signal line INRST and the input of the inverter 115. The output of the inverter 115 is connected to the signal line BINRST illustrated in FIGS. 2 and 3.

Figure 5:
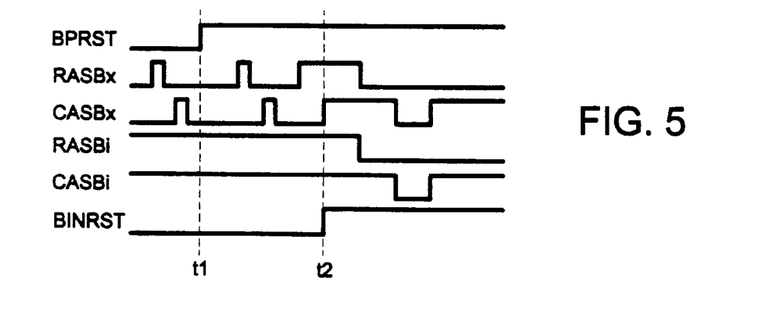
FIG. 5 is a timing chart representing the operation of the circuit in the first embodiment.

The circuits in FIGS. 2 and 4 illustrate the first voltage control systems while the circuits in FIGS. 3 and 4 illustrate the second voltage control systems. Operation of the first and second voltage control systems is illustrated in the timing chart depicted in FIG. 5. Referring to FIG. 5, the signal generator for the power on generates a predetermines voltage during the time period between a predetermined time and the time when the power is turned on. The control signal BPRST, generated from the power on signal generator, is "L" from the time the power source turns on until time t1. After time t1, the BPRST is "H," as illustrated in FIG. 5.

(1) The Case when the Control Signal BPRST is "L " (to Time t1 in FIG. 5):

The operation of the circuit illustrated in FIG. 4 is split into two parts, when the control signal BPRST is "L" and when it is "H." Since one input of the NAND gate 111 is set to "L," node 130 serves as the "H." The control signal INRST serves as a "H" and the control signal BINRST serves as "L." The transfer gate shown in FIGS. 2 and 3 is set to the off position. Consequently, RASBi is disconnected to RASBx and CASBi is disconnected to CASBx. Therefore, RASBx is disconnected to the memory block in FIG. 1 and the memory block is unable to perform normal operations (e.g., reading and writing modes).

(2) The Case when the BPRST is "H" (After Time t1 in FIG. 5):

One of the input leads of NAND gate 111 is set to "H." When RASBx and CASBi are "H," node 120 serves an "H." Accordingly, node 130 serves as "L," and the transfer gate in FIGS. 2 and 3 are set to the on position. Consequently, RASBi is connected to RASBx and CASBi is connected to CASBx. Therefore, the memory block carries out normal operations.

Usually, at the time power is turned on an electronic circuit experiences a high possibility that noise is added to the input signal. If noise does occur and reaches the memory block through a control signal line such as CASBx, and RASBx, latch-up can occur. However, using the circuits described in this invention, from the time the power source turns on, to the predetermined time t1, the control signal BPRST is "L." The transfer gate is turned off as illustrated in FIGS. 2 and 3. Therefore, this invention prevents abnormal signals generated at the time the power source turns on, from reaching the memory block. Therefore, an abnormal signal never reaches the sensitive memory block. An internal circuit in the memory block would be destroyed if an abnormal signal, such as when the power source turns on, reaches the sensitive memory circuitry. This invention prevents the abnormal signal from reaching the memory block and reduces the cost of logic-hybrid memory systems.

Figure 6:
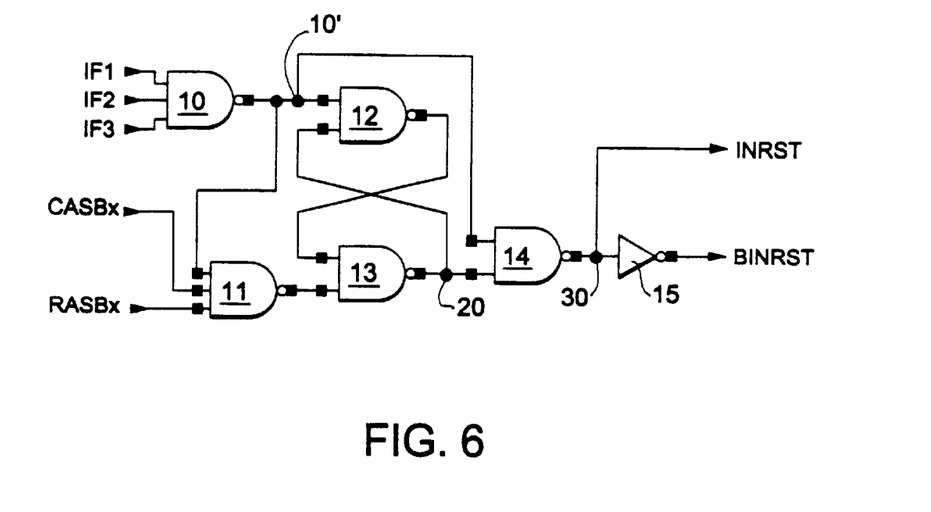
FIG. 6 shows another part of the first and second voltage control circuits in the second embodiment of this invention.

The second embodiment is similar to the first embodiment. The circuit illustrated in FIGS. 2 and 6 show the first voltage control system, while the circuit illustrated in FIGS. 3 and 6 show the second voltage control system. FIG. 6 illustrates the first voltage control circuit and the second voltage control circuit as shown in FIGS. 2 and 3. In FIG. 6 the circuit comprises a series of NAND gates 10, 11, 12, 13 and 14 and an inverter 15. A predetermined number of control signal lines IF1, IF2, and IF3 are connected to the input of the NAND gate 10. These control signals correspond to the control signal line of the logic block in the logic-hybrid memory in FIG. 1(a). The output of NAND gate 10 is connected to the input of the NAND gates 11, 12, and 14. The output of RASBx, CASBx, and the NAND gate 10 are connected to the input of the NAND gate 11. The output of the NAND gates 10 and 13 are connected to the input of the NAND gate 12. The output of the NAND gates 10 and 12 are connected to the input of the. NAND gate 13. The input of the NAND gate 14 is connected to the output of the NAND gates 10 and 13, and the output of NAND gate 14 is connected to the INRST FIGS. 2 and 3 shown in, and to the input of the inverter 15. The output of the inverter 15 is connected to the FIGS. 2 and 3.

Figure 7:
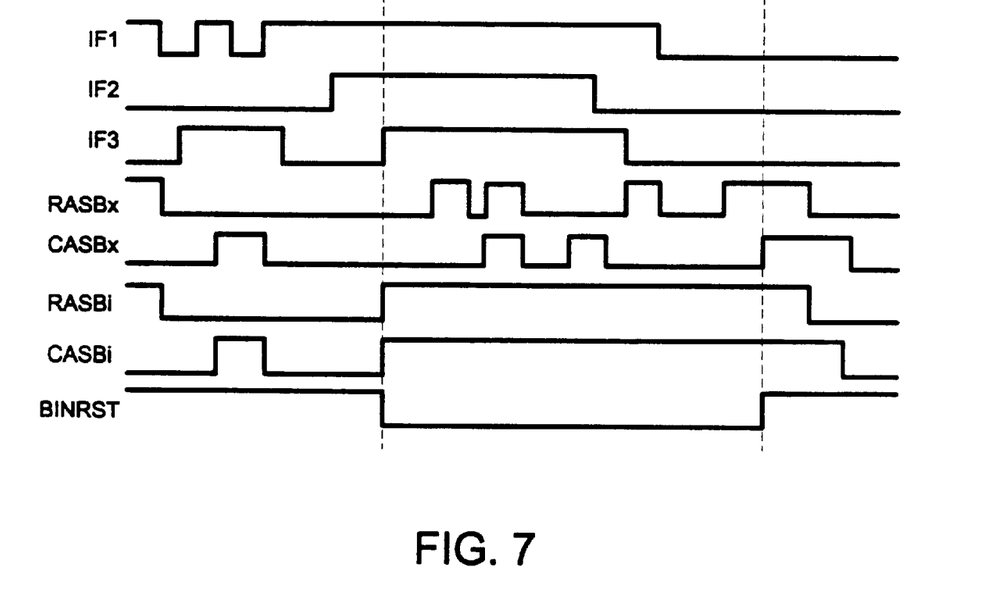
FIG. 7 is a timing chart representing the operation of the circuit in the second embodiment.

The timing chart of the operation of these first and second voltage control systems are shown in FIG. 7. The operation of the circuit or the timing chart in FIG. 7 describe the circuit where the control signal lines 1F1, IF2 and IF3 are high level (written as "H") in FIG. 6, while at the same time an abnormal signal is generated.

(1) The Case Other Than IF1="H," IF2="H," and IF3="H" Simultaneously

At least one of IF1, IF2, and IF3 is low level (written as "L"), the potential of node 10' serves as "H." Not relating to the potential of CASBx and RASBx, etc., the potential of node 20 serves as "H." Therefore, the potential of node 30 serves as "L," INRST="L," and BINRST="H."

Consequently, when the transfer gate illustrated in FIGS. 2 and 3 turn on, RASBx is connected to RASBi, and CASBx is connected to CASBi. A signal RASBx is transmitted to a row decoder (not illustrated in figures), and signal CASBx is transmitted to a column decoder (not illustrated in figures).

(2) The case IF1="H," IF2="H," and IF3="H" Simultaneously

When an abnormal signal is generated, since all inputs of the NAND gate 10 as shown in FIG. 6 are "H," the potential of the node is "L." Therefore, since one of the inputs of the NAND gate 14 is "L," the potential of node 30 is "H." The level of INRST is "H" and the level of BINRST is "L." The transfer gates shown in FIGS. 2 and 3 are set to the off position. Consequently, RASBx is disconnected to RASBi. Since the PMOS transistor 3 is turned on, RASBi is connected to the predetermined potential (VDD is the precharge voltage) as shown in FIG. 2.

CASBx is disconnected to CASBi and since the PMOS transistor 3 is turned on, CASBi is connected to the predetermined potential VDD as shown in FIG. 3. This is illustrated in FIG. 7. When the control signal lines IF1, IF2 and IF3 are simultaneously set to "H." CASBi and RASBi serve as "H" and the memory block is in a standby state. RASBx and the CASBx do not synchronize, and an abnormal signal is prevented from passing through the RASBi and CASBi respectively, even if IF1, IF2 and IF3 are simultaneously set to "H." The RASBx and the CASBx are "H" and when the IF1, IF2 and IF3 are simultaneously set to "H," the abnormal signal is prevented from passing through the RASBi and CASBi respectively.

The second embodiment, like first embodiment, prevents an abnormal signal from being sent as an input to the semiconductor memory and prevents damaging the semiconductor memory. Since the memory operation becomes stabilized, a less expensive system is achieved.

If an abnormal signal is prevented from passing through the RASBi and CASBi, RASBi and CASBi can be given the value equal to the precharge potential VDD when the PMOS transistor 3 turns on. Accordingly, this allows the semiconductor memory to be in a standby state.

Figure 8:
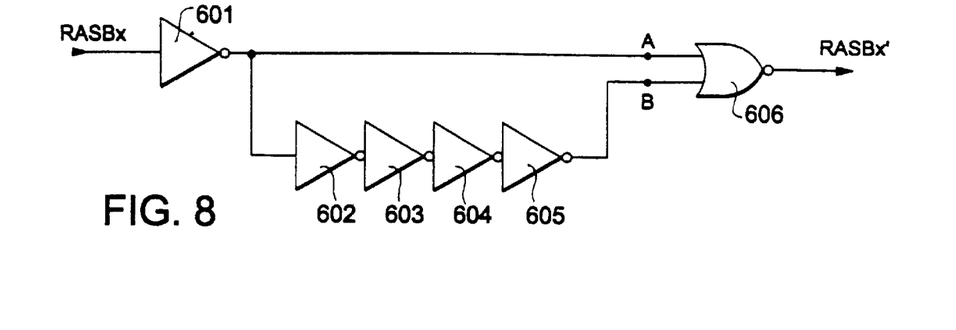
FIGS. 8 and 9 shows another part of the first and second voltage control circuits in the third embodiment of this invention.
Figure 9:
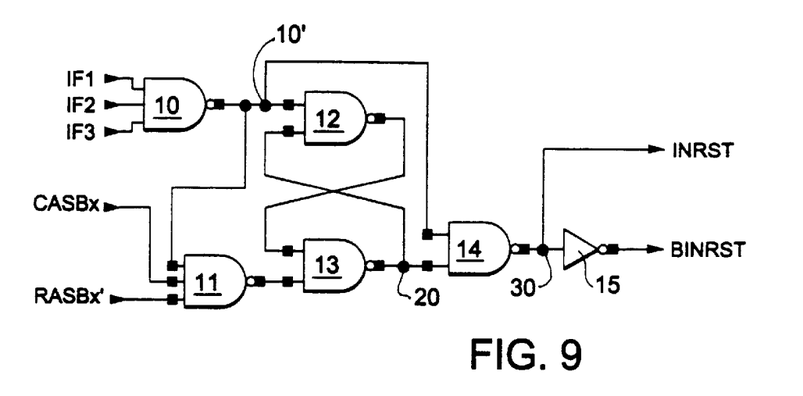

The third embodiment of voltage control is illustrated in FIG. 9. This circuit is similar to the circuit illustrated as shown in FIG. 6. However, it differs from FIG. 6 where the three inputs of the NAND gate 11 are RASBx', CASBx and the output from NAND gate 10. The signal of RASBx' is generated by inputting RASBx into the circuit shown in FIG. 8. The circuit illustrated in FIG. 8 is used to shape (widen or narrow) the width of the signal pulse. The circuit contains an inverter 601 receiving the signal RASBx. The output of the inverter 601 is split with one path becoming one of the input leads to NOR gate 606. The second path passes through the inverter chain 602, 603, 604, and 605 and also becomes one of the leads to the NOR gate 606. NOR gate 606 provides the output signal RASBx' and becomes the RASBx' signal input into NAND gate 11 illustrated in FIG. 9.

Figure 10A:
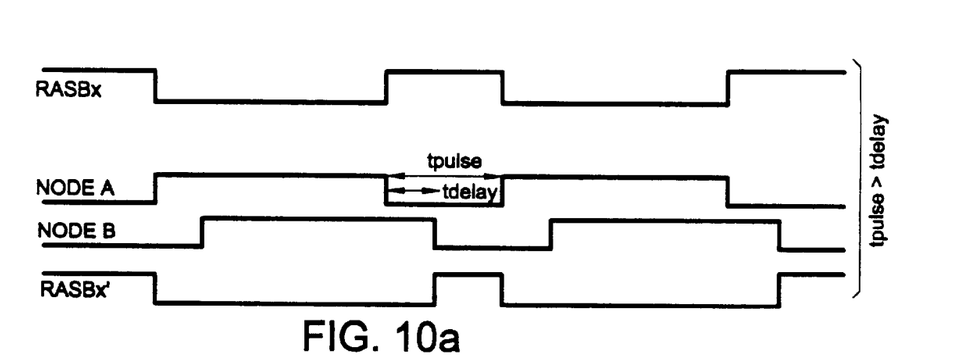
FIG. 10(a) and FIG. 10(b) are timing charts representing the operation of the circuit shown in FIG. 8.
Figure 10B:
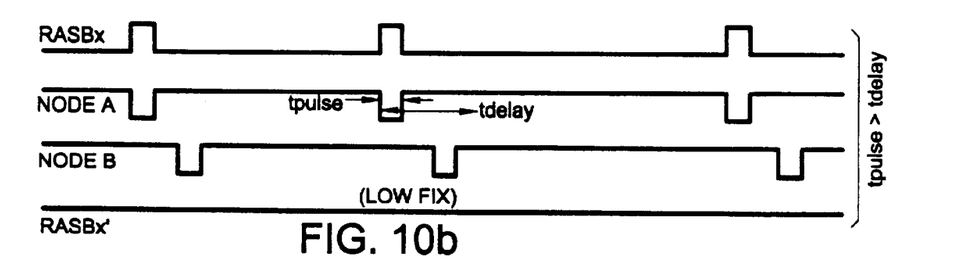

FIGS. 10(a) and 10(b) illustrate the timing chart of the circuit disclosed in FIG. 8. A signal passing through node B is the output of the inverter chain 602, 603, 604, and 605. The signal passing through node B is slightly delayed compared with the signal passing through node A. The amount of delay is defined as tdelay. A width of signal pulse RASBx is defined as tpulse.

FIG. 10(a) illustrates a waveform representing the case when tdelay<tpulse which occurs when the memory block is operating normally. The waveform represented in FIG. 10(a) is the waveform of mode A synchronized to RASBx. FIG. 10(b) illustrates the waveform representing the case where tdelay>tpulse. This event occurs when the circuit in the logic block operates abnormally and produces a narrow width of signal pulse RASBx. The level of node A when compared to the level of node B does not produce an "L" simultaneously. Therefore, RASBx' is fixed as "L." Consequently, FIG. 9 is provided a signal fixed "L" when the width of the signal pulse of RASBx is very narrow. In FIG. 9, when the control signal lines IF1, IF2 and IF3 are "H," simultaneously, an abnormal signal is assumed generated.

(1) The Case IF1="H," IF2="H," and IF3="H" Simultaneously (Generation of an Abnormal Signal)

Since all the input leads of NAND gate 10 as illustrated in FIG. 9 are "H." the potential of node 10 is an "L." Since one of the input leads to NAND gate 14 is an "L," the potential of node 30 is an "H." Therefore, since the level of the INRST is "H," and the level of BINRST is "L," then the transfer gates illustrated in FIGS. 2 and 3 and turned off Consequently, RASBx is disconnected to RASBi. Since PMOS transistor 3 is turned on, RASBi is connected to the predetermined potential VDD as illustrated in FIG. 2. Also, CASBx is disconnected to CASBi. Since the PMOS transistor 3 is turned on, CASBi is connected to the predetermined potential VDD as illustrated in FIG. 3. When the control signal lines IF1, IF2 and IF3 are simultaneously set to "H," CASBi and RASBi serve as "H" and the memory block enters the standby state.

Figure 11:
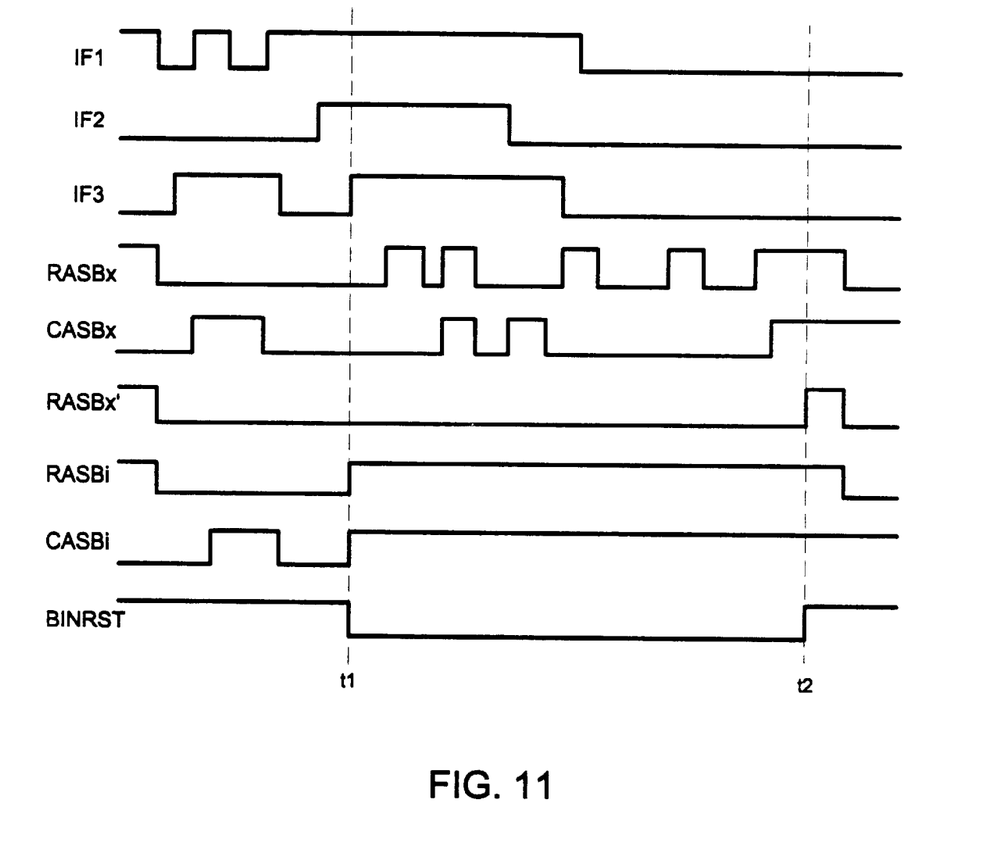
FIG. 11 is a timing chart representing the operation of the circuit in the third embodiment.

(2) During the Time Period t1 Until t2 in FIG. 11

When the width of the signal pulse of RASBx is very narrow, RASBx is fixed "L." At t1, an abnormal signal is prevented from passing through transfer gates illustrated in FIGS. 2 and 3. The abnormal signal is also prevented from passing through the transfer gates between t1 and t2.

(3) After Time Period t2 in FIG. 11

When RASBx' is changed from "L" to "H," INRST is changed to "L" and BINST is changed to "H." At t2, the width of the signal pulse of RASBx returns to a normal value and RASBx is connected to RASBi.

The third embodiment, the abnormal signal continues to be prevented from passing through the transfer gates illustrated in FIGS. 2 and 3 until the width of the signal pulse of RASBx returns to a normal value.

When an abnormal signal is prevented from passing through RASBi and CASBi respectively, RASBi and CASBi can be made into the precharged potential VDD. When the PMOS transistor 3 turns on, this causes the semiconductor memory to be in a stand-by state.

Figure 12:
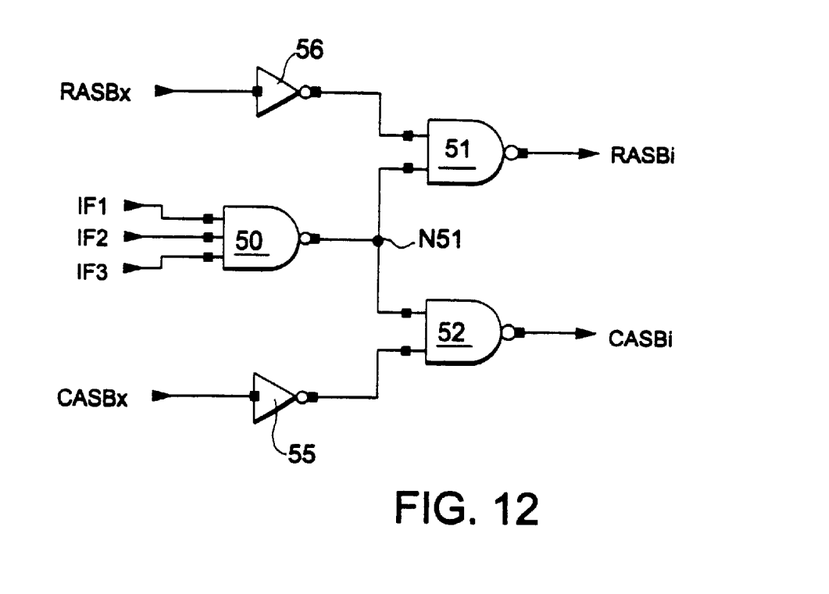
FIG. 12 shows the first and second voltage control circuits in the fourth embodiment of this invention.

In the fourth embodiment, a voltage control circuit is illustrated in FIG. 12. This circuit comprises NAND gates 50, 51 and 52 and inverters 55 and 56. The control signal lines IF1, IF2 and IF3 are input into NAND gate 50. NAND gate 50 acts as the abnormal signal detection circuit. An inverted signal of a control signal line RASBx and the output of the NAND gate 50 are connected to the input terminal of the NAND gate 51. The output of NAND gate 51 is connected to the control signal line RASBi. An inverted signal of a control signal line CASBx and the output of the NAND gate 50 are connected to the input terminal of the NAND gate 52. The output terminal of the NAND gate 52 is connected to the control signal line CASBi.

(1) The Case Other Than IF1="H," IF2="H," and IF3="H" Simultaneously

Since at least one of the control signal lines IF1, IF2 and IF3 are "L," node N51 serves as "H." Since one input of the NAND gate 51 serves as "L," when RASBx is "H," RASBi serves as "H." Since one input of the NAND gate 51 serves as "H" when RASBx is "L," RASBi serves as "L." When considering NAND gate 52, the timing chart of CASBi is similar to that of CASBx. Therefore, the state of RASBi and CASBi follow the states of RASBx and CASBx, regardless of the state of a control signal line (equal to the node 51), respectively.

(2) The Case IF1="H," IF2="H," and IF3="H" Simultaneously, an Abnormal Signal is Generated Since the potential of the node N51 serves as "L," RASBi and CASBi serve as "H" (precharge potential), regardless of the states of RASBx and CASBx. When an abnormal signal is generated, RASBi and CASBi serve as "H," and the semiconductor memory is in a standby state.

Figure 13:
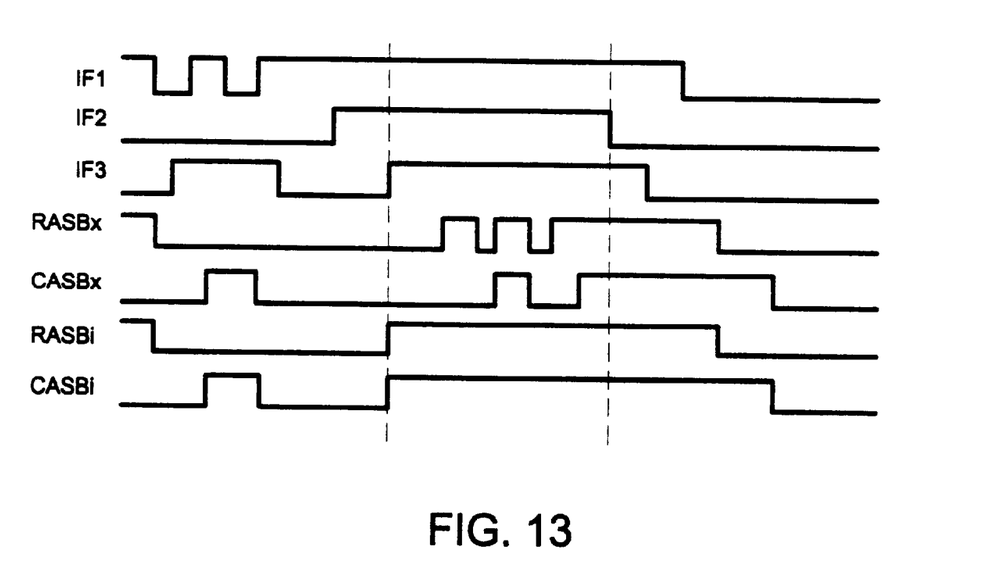
FIG. 13 is a timing chart representing the operation of the circuit in the fourth embodiment.

A timing chart about the operation of the circuit is illustrated in FIG. 13. FIG. 13 shows when all of the control signals IF1, IF2 and IF3 are set to "H," the RASBi and the CASBi serve as "H," then the memory will be in a standby state.

The circuit described in the fourth embodiment is simplified when compared to the first to third embodiments because the transfer gates illustrated in FIGS. 2 and 3 are not necessary. The memory block is disconnected to the logic block and the memory block maintains a precharge state until an external circuit (e.g., the logic block) operates correctly from immediately after the power source turns on.

Although both RASB and CASB are intercepted in the middle, this intercept is permitted. However, since there are usually many elements connected to a word line than that connected to a bit line, therefore the fourth embodiment only applies to RASB. In logic-hybrid memory, since a logic circuit (e.g., NAND gate, or inverter) in the logic block requires a power source, it is often influenced by noise. This noise can produce abnormal signals that can damage various circuits. Therefore, all embodiments described in this invention apply to logic-hybrid memory.

Please note that while the specification in this invention has been described in relation to certain preferred embodiments, it will be apparent to those skilled in the art that the invention is capable of alternative embodiments and that certain embodiments described in this invention can be varied considerably without departing from the basic scope and principles of the invention.

What is claimed is:

1. A semiconductor device for use with a memory cell, the semiconductor device comprising:
   a memory cell select control signal line configured to control a selection of the memory cell; and
   a transfer gate control circuit configured to either cut off or make a connection to the memory cell select control signal line in accordance with a set of voltages of a plurality of interface signals,
   wherein the transfer gate control circuit comprises a first NAND gate inputting the plurality of interface signals, a second NAND gate inputting a signal connectable to said memory cell select control signal line, a third NAND gate inputting an output of the first NAND gate, a fourth NAND gate inputting an output of the second NAND gate and formulating a latch circuit with the third NAND gate, and a fifth NAND gate inputting the output of the first NAND gate and an output of the fourth NAND gate and generating a transfer control signal.

2. A semiconductor device comprising:
   a memory block having a plurality of bit lines arranged in a column direction, a plurality of word lines arranged in a row direction intersecting the column direction, a plurality of memory cells arranged in matrix form and connected to the plurality of bit lines and the plurality of word lines;
   a control signal line configured to carry a control signal for operating the memory block; and
   a control circuit controlled in accordance with at least one interface signal and configured to both cut off the control signal and set the memory block in a standby state when the at least one interface signal is a predetermined state other than a normal state for reading data from the memory block and writing data to the memory block.

3. A semiconductor device comprising:
   a memory block having an address decoder;
   a control signal line configured to carry a control signal for operating the memory block and inputted into the address decoder; and
   a control circuit controlled in accordance with at least one interface signal and configured to both cut off the control signal to the address decoder and set the memory block to a precharge state when the at least one interface signal is a predetermined state other than a normal state for reading data from the memory block and writing data to the memory block.

4. A semiconductor device comprising:
   a memory block;
   a control signal line configured to carry a control signal comprising at least one of a row address strobe signal and a column address strobe signal; and
   a control circuit controlled in accordance with at least one interface signal and configured to both cut off the control signal and set the memory block to a precharge state when the at least one interface signal is a predetermined state other than a normal state for reading data from the memory block and writing data to the memory block.

5. The semiconductor device according to claim 4, wherein the row address strobe signal is an inverted row address strobe and the column address strobe signal is an inverted column address strobe.

6. A semiconductor device comprising:
   a memory block;
   a control signal line coupled to the memory block and configured to carry a control signal for operating the memory block;
   an address decoder configured to select an address of the memory block in accordance with an address signal; and
   a control circuit coupled to the memory block and controlled in accordance with at least one interface signal, said control circuit configured to cut off the control signal, thereby setting the memory block to a precharge state regardless of the address signal when the at least one interface signal is a predetermined state other than a normal state for reading data from the memory block and writing data to the memory block.

7. The semiconductor device according to claim 6, wherein the control circuit comprises a first NAND gate inputting the at least one interface signal, a second NAND gate inputting a signal connected to the control signal line, a third NAND gate inputting an output of the first NAND gate, a fourth NAND gate inputting an output of the second NAND gate and formulating a latch circuit with the third NAND gate, and a fifth NAND gate inputting the output of the first NAND gate and an output of the fourth NAND gate and generating a transfer control signal.

8. A semiconductor device according to claim 6, wherein the control circuit comprises a first NAND gate inputting the at least one interface signal, a second NAND gate inputting an output of the first NAND gate and the control signal, and a third NAND gate inputting an output of the first NAND gate and cutting off the control signal line in accordance with the at least one interface signal.

9. The semiconductor device according to claim 6, wherein the control signal line selects at least one of a plurality of memory cells of the memory block.

10. The semiconductor device according to claim 9, wherein the control signal line controls a selection from row addresses of the memory block.

11. The semiconductor device according to claim 9, wherein the control signal line controls a selection from column address of the memory block.

12. The semiconductor device according to claim 6, wherein the control circuit is configured to set the control signal line to a predetermined voltage level when the control circuit cuts off the control signal line.

13. The semiconductor device according to claim 12, wherein the predetermined voltage level is a power supply voltage level.

14. A semiconductor device comprising:
a memory block;
a control signal line coupled to the memory block and configured to carry a control signal for operating the memory block; and
a control circuit coupled to the memory block and controlled in accordance with at least one interface signal, said control circuit configured to cut off the control signal in accordance with at least one interface signal, thereby setting the memory block to a precharge state when the at least one interface signal is a predetermined state other than a normal state for reading data from the memory block and writing data to the memory block.

15. A semiconductor device comprising:
a memory block;
a logic block;
a control signal line configured to connect the memory block and the logic block and carry a control signal for operating the memory block; and
a control circuit configured to one of cut off and make a connection to the control signal in accordance with at least one interface signal,
wherein the at least one interface signal performs an interface of the logic block and the memory block.

16. A semiconductor device comprising:
a memory block including a plurality of memory cells, each of the plurality of memory cells being accessed based on a plurality of address signals inputted to the memory block;
a plurality of control signal lines configured to carry a plurality of control signals and operate the memory block independently of each other; and
a plurality of control circuits controlled in accordance with at least one interface signal and configured to cut off the plurality of control signals simultaneously and set the memory block to a precharge state when the at least one interface signal is a predetermined state other than a normal state for reading data from the memory block and writing data to the memory block.

17. The semiconductor device according to claim 16, wherein the memory block includes an address decoder and one of the plurality of control signal lines is inputted to the address decoder.

18. The semiconductor device according to claim 16, wherein one of the plurality of control signals comprises at least one of a row address strobe signal and a column address strobe signal.

19. The semiconductor device according to claim 16, wherein the control circuit sets the memory block to the precharge state regardless of the address signal.

20. The semiconductor device according to claim 16, wherein one of the plurality of control signal lines selects at least one of the plurality of memory cells.

21. The semiconductor device according to claim 20, wherein one of the plurality of control signal lines controls a selection from a row address of the memory block.

22. The semiconductor device according to claim 20, wherein one of the plurality of control signal lines controls a selection from a column address of the memory block.

23. The semiconductor device according to claim 16, wherein the plurality of control circuits are configured to set the plurality of control signal lines to a predetermined voltage level when the plurality of control circuits cut off the plurality of control signals.

24. The semiconductor device according to claim 23, wherein the predetermined voltage level is a power supply voltage level.

25. A semiconductor device comprising:
a memory block having a plurality of bit lines arranged in a column direction, a plurality of word lines arranged in a row direction intersecting the column direction, and a plurality of memory cells arranged in matrix form and connected to the plurality of bit lines and the plurality of word lines;
a control signal line configured to carry a control signal for operating the memory block; and
a control circuit controlled in accordance with at least one interface signal and configured to cut off the control signal when said at least one interface signal is a predetermined state other than a normal state for reading data from said memory block and writing data to said memory block.

26. The semiconductor device according to claim 25, wherein the control circuit comprising a first NAND gate inputting the at least one interface signal, a second NAND gate unputting a signal connectable to the control signal line, a third NAND gate inputting an output of the first NAND gate, a fourth NAND gate inputting an output of the second NAND gate and formulating a latch circuit with the third NAND gate, and a fifth NAND gate inputting the output of the first NAND gate and an output of the fourth NAND gate and generating a transfer control signal.

27. A semiconductor device according to claim 25, wherein the control circuit comprises a first NAND gate inputting the at least one interface signal, a second NAND gate inputting an output of the first NAND gate and the control signal, and a third NAND gate inputting an output of the first NAND gate and cutting off the control signal.

28. The semiconductor device according to claim 25, wherein the control signal line selects at least one of the memory cells of the memory block.

29. The semiconductor device according to claim 28, wherein the control signal line controls a selection from a row address of the memory block.

30. The semiconductor device according to claim 28, wherein the control signal line controls a selection from a column address of the memory block.

31. The semiconductor device according to claim 25, wherein the control circuit is configured to set the control signal line to a predetermined voltage level when the control circuit cuts off the control signal.

32. The semiconductor device according to claim 31, wherein the predetermined voltage level is a power supply voltage level.

33. A semiconductor device comprising:
a memory block and a logic block formed on a semiconductor chip, the memory block comprising a plurality of bit lines arranged in a column direction, a plurality of word lines arranged in a row direction intersecting the column direction, and a plurality of memory cells arranged in matrix form and connected to the plurality of bit lines and the plurality of word lines;
a control signal line configured to carry a control signal for operating the memory block; and a control circuit controlled in accordance with at least one interface signal and configured to cut off the control signal, wherein the at least one interface signal performs an interface of the logic block and the memory block.

34. The semiconductor device according to claim 33, wherein the control circuit is configured to cut off the control signal when said at least one interface signal is a predetermined state other than a normal state for reading data from said memory block and writing data to said memory block.

35. The semiconductor device according to claim 33, wherein the control circuit comprises a first NAND gate inputting the at least one interface signal, a second NAND gate inputting a signal connectable to the control signal line, a third NAND gate inputting an output of the first NAND gate, a fourth NAND gate inputting an output of the second NAND gate and formulating a latch circuit with the third NAND gate, and a fifth NAND gate inputting the output of the first NAND gate and an output of the fourth NAND gate and generating a transfer control signal.

36. A semiconductor device according to claim 33, wherein the control circuit comprises a first NAND gate inputting the at least one interface signal, a second NAND gate inputting an output of the first NAND gate and the control signal, and a third NAND gate inputting an output of the first NAND gate and cutting off the control signal line.

37. The semiconductor device according to claim 33, wherein the control signal line selects at least one of the memory cells of the memory block.

38. The semiconductor device according to claim 37, wherein the control signal line controls a selection from a row address of the memory block.

39. The semiconductor device according to claim 37, wherein the control signal line controls a selection from a column address of the memory block.

40. The semiconductor device according to claim 33, wherein the control circuit is configured to set the control signal line to a predetermined voltage level when the control circuit cuts off the control signal.

41. The semiconductor device according to claim 40, wherein the predetermined voltage level is a power supply voltage level

* * * * *

UNITED STATES PATENT AND TRADEMARK OFFICE
CERTIFICATE OF CORRECTION

PATENT NO. : 6,567,336 B2
DATED : May 20, 2003
INVENTOR(S) : Satoru Takase

It is certified that error appears in the above-identified patent and that said Letters Patent is hereby corrected as shown below:

Column 10,
Line 29, "unputting" has been replaced with -- inputting --.

Column 12,
Line 20, "level" has been replaced with -- level. --.

Signed and Sealed this

Seventh Day of October, 2003

JAMES E. ROGAN
*Director of the United States Patent and Trademark Office*